US011843349B2

(12) United States Patent
Gostein et al.

(10) Patent No.: US 11,843,349 B2
(45) Date of Patent: Dec. 12, 2023

(54) IN-SITU I-V MEASUREMENT OF A MODULE IN A PV ARRAY

(71) Applicants: Michael Gostein, Austin, TX (US); William Stueve, Austin, TX (US)

(72) Inventors: Michael Gostein, Austin, TX (US); William Stueve, Austin, TX (US)

(\*) Notice: Subject to any disclaimer, the term of this patent is extended or adjusted under 35 U.S.C. 154(b) by 0 days.

(21) Appl. No.: 17/739,823

(22) Filed: May 9, 2022

(65) Prior Publication Data

US 2022/0360216 A1 Nov. 10, 2022

Related U.S. Application Data

(60) Provisional application No. 63/327,702, filed on Apr. 5, 2022, provisional application No. 63/186,237, filed on May 10, 2021.

(51) Int. Cl.
*H02S 50/15* (2014.01)
*H02S 50/10* (2014.01)
*G01R 21/06* (2006.01)

(52) U.S. Cl.
CPC .............. *H02S 50/10* (2014.12); *G01R 21/06* (2013.01)

(58) Field of Classification Search
CPC ...... H02S 50/10; G06F 11/08; G06F 11/1004; G06F 11/1435; G06F 11/1446; G06F 3/0619; G06F 3/0631; G06F 3/064; G06F 3/0673; G01R 21/06
See application file for complete search history.

(56) References Cited

U.S. PATENT DOCUMENTS

| | | | |
|---|---|---|---|
| 4,163,194 A * | 7/1979 | Ross | H02S 50/10 136/290 |
| 8,952,715 B2 | 2/2015 | Gillispe | |
| 11,031,906 B2 | 6/2021 | Ni | |
| 11,167,321 B2 | 11/2021 | Jones | |
| 2012/0053867 A1 * | 3/2012 | Dunn | H02S 50/10 702/58 |
| 2012/0256584 A1 * | 10/2012 | Crites | H02S 50/10 324/750.01 |

(Continued)

FOREIGN PATENT DOCUMENTS

| | | |
|---|---|---|
| CN | 107196604 A | 9/2017 |
| CN | 106712716 B | 2/2019 |

(Continued)

OTHER PUBLICATIONS

U.S. Appl. No. 16/289,779, filed Jul. 14, 2020, Gostein.

(Continued)

*Primary Examiner* — Son T Le
*Assistant Examiner* — Adam S Clarke

(57) ABSTRACT

In one respect, disclosed is an in-situ current-voltage (I-V) measurement device for photovoltaic modules in a photovoltaic array, comprising a variable load, wherein the variable load is configured to be connected in parallel with a module, wherein the module is connected in series with at least one other module in a string, such that the module supplies current simultaneously to the string and to the variable load, and wherein the variable load is controlled by a controller, and wherein the controller is configured to shift an I-V operating point of the module, based at least upon varying the variable load.

13 Claims, 9 Drawing Sheets

(56) References Cited

U.S. PATENT DOCUMENTS

2016/0099676 A1   4/2016  Fornage
2018/0234051 A1   8/2018  Ni
2021/0376790 A1  12/2021  Chen

FOREIGN PATENT DOCUMENTS

| CN | 110677118 A | 1/2020 |
| CN | 109861644 B | 7/2020 |
| CN | 110677118 B | 1/2022 |
| JP | 2019040434 A | 3/2019 |

OTHER PUBLICATIONS

U.S. Appl. No. 16/895,356, Jan. 5, 2021, Gostein.
Ortega, New monitoring method to characterize individual modules in large photovoltaic systems, Solar Energy, v. 193, pp. 906-914, Oct. 23, 2019, https://doi.org/10.1016/j.solener.2019.09.099.

* cited by examiner

IN-SITU I-V MEASUREMENT OF A MODULE IN A PV ARRAY

CROSS-REFERENCE TO RELATED APPLICATIONS

This application claims priority to U.S. Provisional Patent Application 63/186,237, filed May 10, 2021, and to U.S. Provisional Patent Application 63/327,702, filed Apr. 5, 2022, both of which are incorporated by reference herein.

STATEMENT OF GOVERNMENT INTEREST

This invention was made with Government support under DE-SC0020012 awarded by the US Department of Energy. The Government has certain rights in this invention.

FIELD OF THE INVENTION

The disclosed subject matter is directed to the measurement of I-V characteristics of modules in photovoltaic (PV) arrays for solar energy production.

SUMMARY

In one respect, disclosed is a device for measuring current-voltage characteristics of at least one photovoltaic module connected to a photovoltaic array powering a load or inverter.

In another respect, disclosed is an in-situ current-voltage (I-V) measurement device for photovoltaic modules, comprising a variable load, wherein said variable load is configured to be connected in parallel with a module, wherein said module is connected in series with at least one other module in a string, such that said module supplies current simultaneously to said string and to said variable load, and wherein said variable load is controlled by a controller, and wherein said controller is configured to shift an I-V operating point of said module, based at least upon varying said variable load.

In another respect, said operating point shifts towards higher current as a current of said variable load is increased.

In another respect, a module current of said module comprises a combination of a string current of said string and a variable load current of said variable load.

In another respect, a device according to the present disclosure comprises a module current measurement circuit and a module voltage measurement circuit, wherein said controller is configured to measure at least a portion of an I-V curve of said module based at least upon varying a variable load current of said variable load and recording readings from said module current measurement circuit and said module voltage measurement circuit.

In another respect, in a pass-through operation mode of said device, said controller configures said variable load to draw substantially zero current from said module.

In another respect, a device according to the present disclosure comprises module connections configured to connect said device to said module and string connections configured to connect said device to said string.

In another respect, a device according to the present disclosure comprises a coupling circuit connecting said module connections to said string connections.

In another respect, said coupling circuit is configured as a DC-DC switching power converter, comprising at least a release transistor configured to alternately enable and disable current flow, wherein a duty cycle of said release transistor is controlled by said controller, and wherein said controller is configured to shift said operating point of said module based at least upon varying said duty cycle.

In another respect, said operating point of said module shifts towards lower current as said duty cycle is reduced.

In another respect, a device according to the present disclosure comprises a module current measurement circuit and a module voltage measurement circuit, wherein said controller is configured to measure at least a portion of an I-V curve of said module based at least upon varying said duty cycle and recording readings from said current measurement circuit and said voltage measurement circuit.

In another respect, in a pass-through operation mode of said device, said controller configures said duty cycle to 100%, continuously enabling said current flow through said release transistor.

In another respect, said controller configures said duty cycle at a fixed value less than 100% and varies said current of said variable load to shift said I-V operating point along an I-V curve of said module.

In another respect, a device according to the present disclosure comprises a module current measurement circuit and a module voltage measurement circuit, wherein said controller is configured to measure at least a portion of said I-V curve based at least upon varying a variable load current through said variable load, varying said duty cycle, and recording readings from said current measurement circuit and said voltage measurement circuit.

In one respect, disclosed is a method of measuring at least a portion of a current-voltage (I-V) curve for a photovoltaic module in-situ within a photovoltaic array, comprising connecting a variable load in parallel with said module, wherein said module is connected in series with at least one other module in a string, allowing said module to supply current simultaneously to said string and to said variable load, and varying said variable load to shift an I-V operating point of said module.

In another respect, a method according to the present disclosure comprises measuring a module current of said module with a module current measurement circuit, measuring a voltage of said module with a voltage measurement circuit, varying said variable load, and recording readings from said module current measurement circuit and said voltage measurement circuit.

In another respect, a method according to the present disclosure comprises, in a pass-through operation mode, configuring said variable load to draw substantially zero current from said module.

In another respect, a method according to the present disclosure comprises connecting a coupling circuit between said module and said string, wherein said coupling circuit is configured as a DC-DC switching power converter, comprising at least a release transistor configured to alternately enable and disable current flow, and varying a duty cycle of said release transistor to shift said operating point of said module based at least upon varying said duty cycle.

In another respect, a method according to the present disclosure comprises shifting said operating point towards lower current by reducing said duty cycle.

In another respect, a method according to the present disclosure comprises measuring a module current of said module with a module current measurement circuit, measuring a voltage of said module with a voltage measurement circuit, varying said variable load and/or said duty cycle, and recording readings from said module current measurement circuit and said voltage measurement circuit.

BACKGROUND

Figure 1:
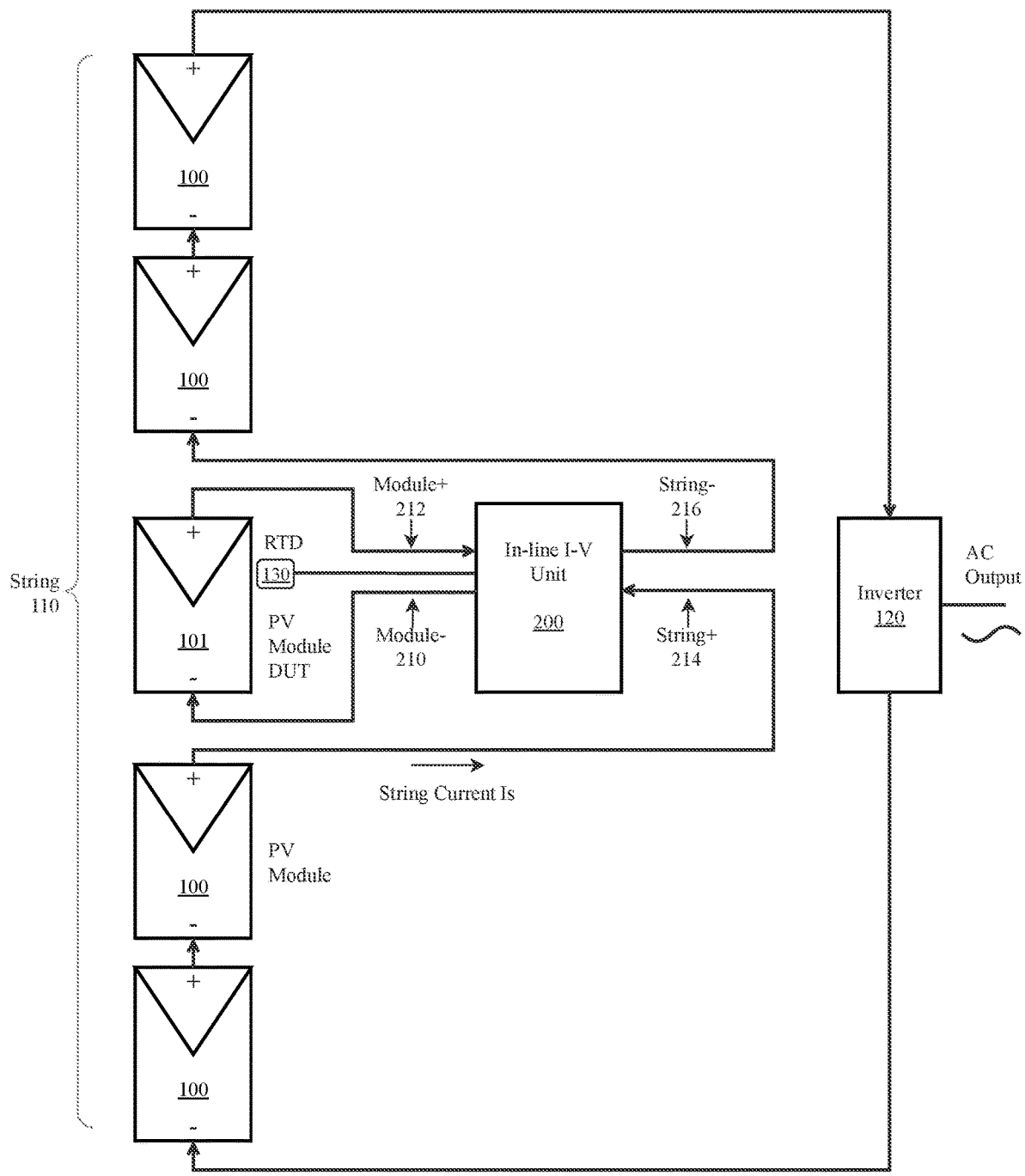
FIG. 1 depicts an in-situ I-V unit (200) connected to a photovoltaic module device under test (101) which is part of a string (110) connected to a load or inverter (120), in accordance with some embodiments.

Photovoltaic (PV) modules, also known as solar panels, are used to produce energy in solar energy installations, also known as solar power plants or PV power plants. PV power plants are comprised of a PV array, which is an array of PV modules, together with equipment to utilize the power produced by the modules. Such additional equipment could include a load powered by the array, an inverter to convert the power provided by the array to alternating current (AC) for immediate use or transmission, or an energy storage system. PV power plants, especially utility-scale or commercial-scale installations, frequently employ measurement systems for assessing and monitoring plant performance.

DETAILED DESCRIPTION OF THE INVENTION

PV modules may be characterized by their I-V curve, the relationship between PV module output current and voltage, and parameters derived from the curve or associated with particular points on the curve. Key points on the I-V curve include short-circuit current (Isc), open-circuit voltage (Voc), maximum power point (MPP), maximum power (Pmax or Pmpp), maximum power point voltage (Vmp), and maximum power point current (Imp). Other points and values of interest may also be defined. I-V characteristics of a PV module may include any of the values defined in the preceding, additional values and metrics, and/or the entire I-V curve.

Exemplary PV modules used in PV power plants have Isc between 2 amps and 30 amps, Voc between 20 volts and 300 volts, and Pmax between 20 W and 2000 W, when tested at standard test conditions (STC) corresponding to incident solar irradiance of 1000 W/m$^2$, module temperature of 25 degrees C., and air mass 1.5 (AM1.5) solar spectrum. Some modules used in PV power plants may have ratings outside these ranges.

Measuring the I-V characteristics of a PV module installed in a PV power plant can provide useful information relevant to assessing or monitoring performance of the PV power plant. Some parameters of interest for measurement in a solar power plant which may benefit from PV module I-V characteristics measurement include solar irradiance; effective solar irradiance usable by PV modules, including front-side, rear-side, and total irradiance in the case of bifacial PV modules; PV module power output capability; structural shading and electrical mismatch factors that limit PV module power output capability according to shading and/or non-uniformity of irradiance reaching PV modules; power losses due to soiling, the accumulation of dust and dirt on PV modules; and others.

In one respect, disclosed is a device or system for measuring I-V characteristics of a PV module connected to a PV array. Advantageously, according to the disclosed subject matter I-V characteristics may be measured on a PV module device under test that remains connected to the PV array, with only minimal disruption to the power and energy output of the PV module and minimal or negligible disruption to the operation of the array and any connected power utilization or conversion equipment. We designate such measurement as "in-situ" or, equivalently "in-line".

FIG. 1 depicts an exemplary string (110) of PV modules (100, 101) which provide power to a PV array and thereby to inverter (120) which produces AC power output. The PV array may comprise multiple strings (110) which may be comprised of varying numbers of PV modules (100, 101) arranged in series and/or parallel combinations. One of the modules (101) of string (110) is a PV module device under test (DUT) (101) whose I-V characteristics are to be measured by in-situ I-V measurement unit (200). PV module DUT (101) is connected to in-situ I-V unit (200) via module + connection (212) and module − connection (210), which may comprise cables, terminals, or other means. In-situ I-V unit (200) is connected to modules (100) of string (110) via string + (214) and string − (216) connections, while may comprise cables, terminals, or other means. Arrows in FIG. 1 indicate the direction of current flow. PV module DUT (101) is in series with PV modules (100) of string (110) via its connection to in-situ I-V unit (200).

Besides the exemplary arrangement depicted in FIG. 1, other numbers of modules, strings, and inverters, and other series and parallel combinations or types of power utilization equipment such as loads and storage systems, could be used and be within the scope of this disclosure.

In-situ I-V unit (200) may be configured in various operation modes, including a pass-through mode in which PV module DUT (101) is directly connected in series within string (110) with minimal loss of power, and a measurement mode in which I-V characteristics of PV module DUT (101)

are measured. In-situ I-V unit (200) may be configured to periodically change between a pass-through mode and a measurement mode.

In a pass-through mode of operation, DUT (101) is in series with string (110), and, normally, the current flowing through string (110), denoted the string current, will also be flowing through DUT (101). DUT (101) will then operate at a current and voltage operating point where the current is defined by the string current and the corresponding voltage is determined by the I-V curve. In a measurement mode of operation in-situ I-V unit (200) causes the operating point of DUT (101) to shift to higher or lower current (equivalently, lower or higher voltage) while in-situ I-V unit (200) measures at least a portion of the I-V curve.

In one embodiment temperature sensor (130), which may comprise a resistive temperature detector (RTD) or other sensor type, is used by in-situ I-V unit (200) to measure a temperature of DUT (101). Said temperature may be used to calibrate or adjust I-V characteristics measured by in-situ I-V unit (200) or other values calculated therefrom. In another embodiment, in-situ I-V unit (200) determines the temperature of DUT (101) from its I-V characteristics, for example by using the open-circuit voltage measurement of temperature determination.

Figure 2A:
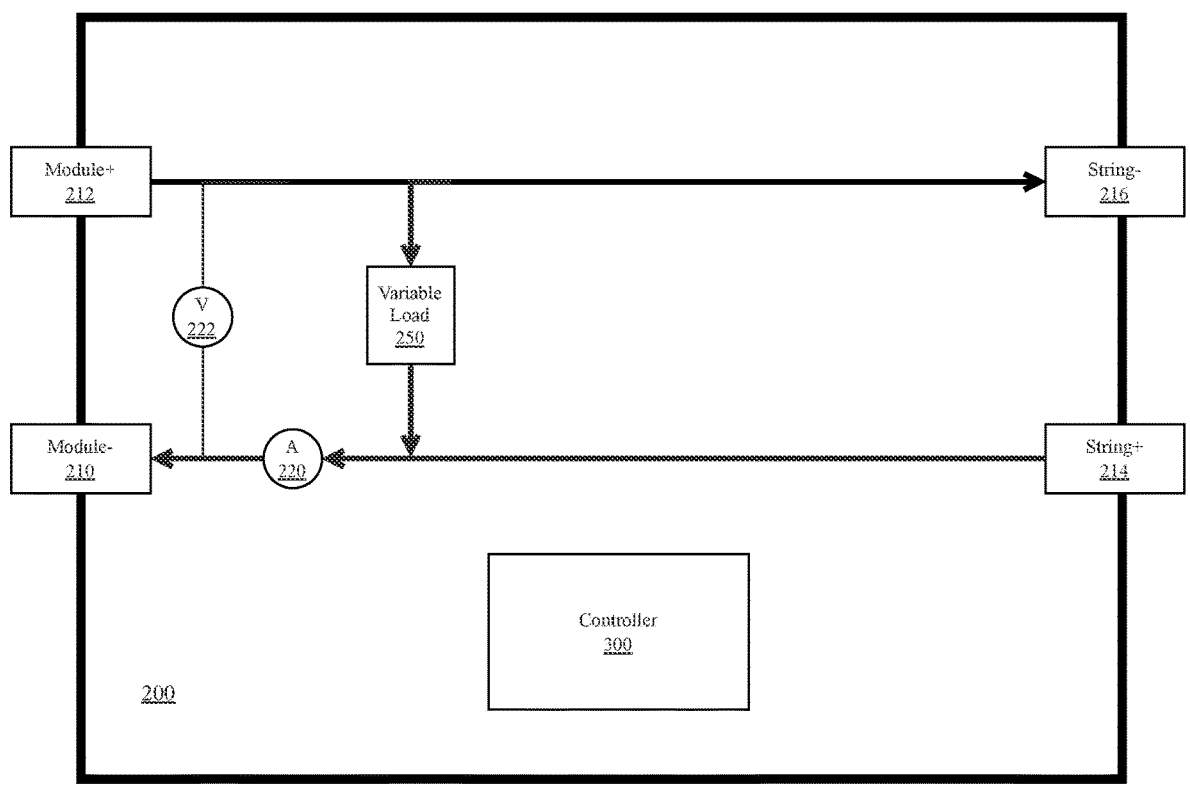
FIG. 2A depicts main components of an embodiment of an in-situ I-V unit (200), in accordance with some embodiments.

FIG. 2A depicts main elements of an embodiment of in-situ I-V unit (200) according to the present disclosure. Module − (210), module + (212), string + (214), string − (216) connections serve the purposes discussed in connection to FIG. 1. Current measurement circuit (220) measures the current flowing through PV module DUT (101). Voltage measurement circuit (222) measures the output voltage of PV module DUT (101) applied as input to in-situ I-V unit (200). In one embodiment, variable load (250) draws a variable, programmable current from module DUT (101) controlled by controller (300). Controller (300) controls in-situ I-V unit (200), performs measurements, and communicates data. Controller (300) may comprise, for example, a microcontroller, floating point gate array (FPGA), computer, or similar device.

In one embodiment, variable load (250) comprises a programmable electronic load, which may be implemented using transistors and a feedback circuit designed to control the transistors to achieve a targeted condition, such as a targeted current, voltage, resistance, or power of the variable load (250). In an exemplary embodiment, MOSFET transistors are used with a feedback circuit that controls the MOSFET gate voltages to achieve a targeted current through variable load (250). Variable load (250) dissipates power according to the product of the current through variable load (250) and the voltage across variable load (250). The DUT (101) module supplies power dissipated by variable load (250) and variable load (250) functions to shift the operating point of DUT (101) by drawing current (equivalently, power) from DUT (101). In some embodiments, the DUT (101) module provides current/power simultaneously to variable load (250) and to string (110) (via string connections 214, 216), thereby ultimately to inverter (120) (or any other load in place of inverter (120)) which is supplied by string (110). In some embodiments the current flowing through DUT (101) module comprises a combination of a string current Is and the current flowing through variable load (250), thus providing that drawing a current through variable load (250) shifts the current-voltage (I-V) operating point of DUT (101). Advantageously, in some embodiments this provides that the operating point of DUT (101) is shifted without disconnecting DUT (101) from the string (110) and without dissipating the entire DUT (101) module current in the variable load (250).

In other embodiments, variable load (250) comprises alternate components, such as any other type of transistor, variable resistor, or variable resistance device, with or without a feedback circuit.

In some embodiments, variable load (250) draws from DUT (101) module a current ranging from 1-100% of DUT (101) Isc or a power ranging from 1-100% of DUT (101) Pmax when variable load (250) is in operation. In some embodiments, variable load (250) draws from DUT (101) a current ranging from 1-10% of DUT (101) Isc or a power ranging from 1-10% of DUT (101) Pmax when variable load (250) is in operation.

Figure 2B:
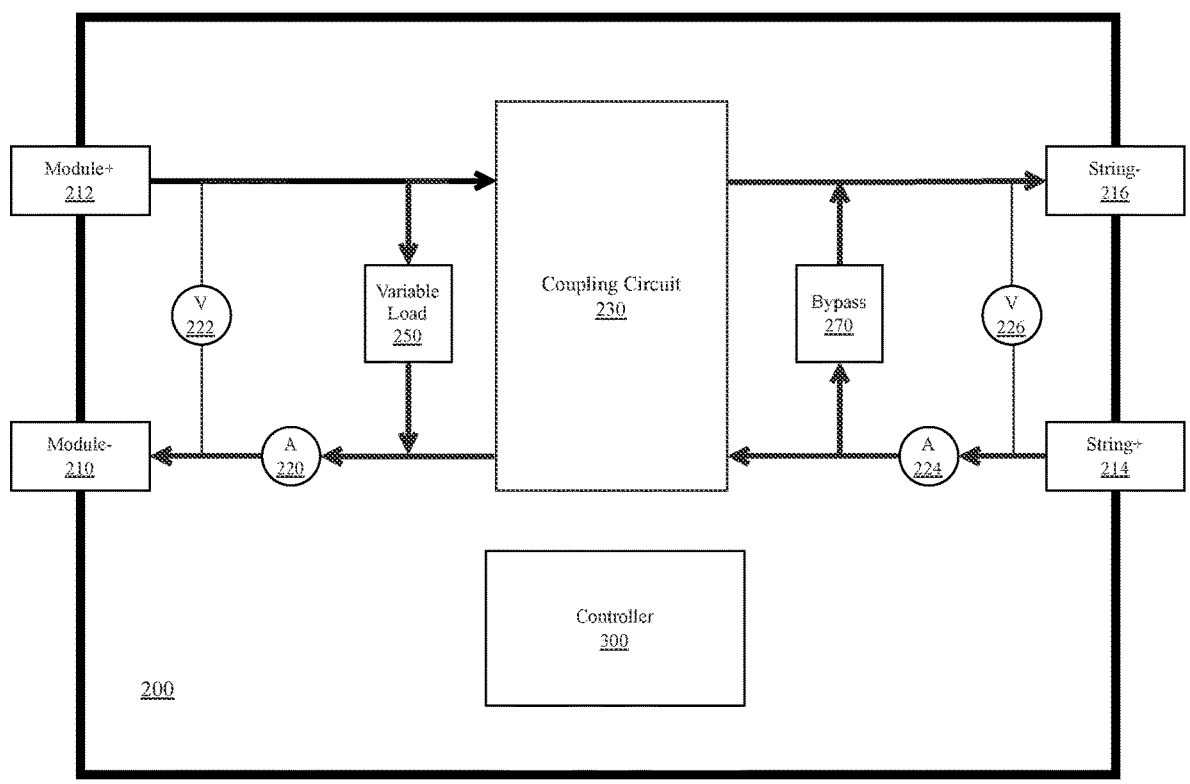
FIG. 2B depicts main components of an embodiment of an in-situ I-V unit (200), in accordance with some embodiments.

FIG. 2B depicts main elements of another embodiment of in-situ I-V unit (200) according to the present disclosure. Module − (210), module + (212), string + (214), string − (216) connections serve the purposes discussed in connection to FIG. 1. Current measurement circuit (220) measures the current flowing through PV module DUT (101). Voltage measurement circuit (222) measures the output voltage of PV module DUT (101) applied as input to in-situ I-V unit (200). In one embodiment, variable load (250) draws a variable, programmable current from module DUT (101) controlled by controller (300). In one embodiment, coupling circuit (230) transfers power from PV module DUT (101) to the output via string + (214) and string − (216) connections. Optionally, current (224) and voltage (226) measurement circuits measure current and/or voltage at the output. Optionally, bypass (270) permits current flowing in string (110) via string + (214) and string − (216) to bypass coupling circuit (230), preventing interruption of current flowing in string (110). Controller (300) controls in-situ I-V unit (200), performs measurements, and communicates data. Controller (300) may comprise, for example, a microcontroller, computer, or similar device.

The potential of string − (216) is normally more positive than the potential of string + (214); polarity designations indicate the polarity of cables from modules (100) of string (110) which are to be connected, not the polarity of relative voltage between (214) and (216). Arrows indicate the normal direction of positive current flow.

Coupling circuit (230) transfers power from PV module DUT (101) to the output via string + (214) and string − (216) connections. In one embodiment, coupling circuit (230) comprises direct connections between (212) and (216) and between (210) and (214), as in FIG. 2A. In another embodiment of coupling circuit (230), the connection between (212) and (216), and/or between (210) and (214), is interrupted by a switch, such as a transistor or other switching device. In another embodiment, coupling circuit (230) comprises a DC-DC switching power converter, comprising transistors, inductors, diodes, and capacitors, and organized, for example, as a buck converter, boost converter, buck-boost converter, or other related or similar topology for DC-DC power conversion, wherein conversion from one DC current/voltage combination to another is achieved by repetitive switching, typically at frequencies ranging from 50 kHz to 1000 kHz, and adjustment of duty cycles of switching in order to achieve a targeted condition. In some configurations, coupling circuit (230) may operate in a switched mode, as discussed. In some configurations, coupling circuit (230) may be configured in a pass-through mode. In some configurations, coupling circuit (230) may comprise one or more switches that connect or disconnect module + and/or − (212, 210) from string − and/or + (216, 214).

In one embodiment, in-situ I-V unit (200) performs measurement of at least a portion of an I-V curve by following the steps of changing the state of variable load (250) and/or changing the state of coupling circuit (230) to change the current and voltage of PV module DUT (101), measuring PV module DUT (101) current and voltage via measurement circuits (220) and (222), and repeating this process to acquire at least a portion of an I-V curve. In one embodiment, during this process PV module DUT (101) continues to provide power to outputs (214, 216) via coupling circuit (230), although potentially with reduced efficiency and/or reduced power delivery during the measurement process.

In one embodiment, in-situ I-V unit (200) alternates between a pass-through operation mode and a measurement operation mode. In a pass-through operation mode variable load (250) is configured to draw substantially zero current (i.e. <1-5% of DUT (101) short-circuit current) and coupling circuit (230) is configured to directly connect module DUT (101) via connections (210, 212) to the outputs (214, 216). In a measurement operation mode coupling circuit (230) and/or variable load (250) are used to alter the current and voltage state of DUT (101) to measure an I-V curve. (In the foregoing, "direct connection" does not preclude intervening measurement circuits (220, 222, 224, 226) or other components or functional blocks which minimally disturb the transfer of power from PV module DUT (101) to the output of in-situ I-V unit (200).)

In one embodiment, the measured I-V curve is a full I-V curve ranging from short-circuit to open-circuit or vice versa. In one embodiment, the I-V curve is measured in one sequence, while in other embodiments it is measured in one or more portions. In one embodiment, the measured I-V curve is a mini I-V curve concentrated on one or more portions of the I-V curve near maximum power or other point or points of interest within the full I-V curve. In one embodiment, measurement is performed while limiting the maximum loss of power output during the measurement to within a threshold of 10%, or other relatively small value; for example, this may be achieved when measuring a portion of the I-V curve near maximum power point by ensuring that current and voltage are maintained at points where power output is within 10% of the maximum power.

In one embodiment, in-situ I-V unit (200) operates in a pass-through mode most of the time, switching to a measurement mode for a short time, for example once per minute. In an exemplary embodiment, a full I-V curve takes at most 500 milliseconds once per minute and a mini I-V curve takes at most 500 milliseconds once every 10 seconds.

In one embodiment controller (300) determines fit parameters from the measured I-V curve, such as short-circuit current, open-circuit voltage, maximum power, voltage at maximum power, and current at maximum power. The parameters that may be determined may depend on which portion of an I-V curve is measured. In one embodiment, fit values and/or I-V curves, or values calculated therefrom, are adjusted or calibrated by the temperature of PV module DUT (101) measured by sensor (130) or other means, as discussed.

Figure 3:
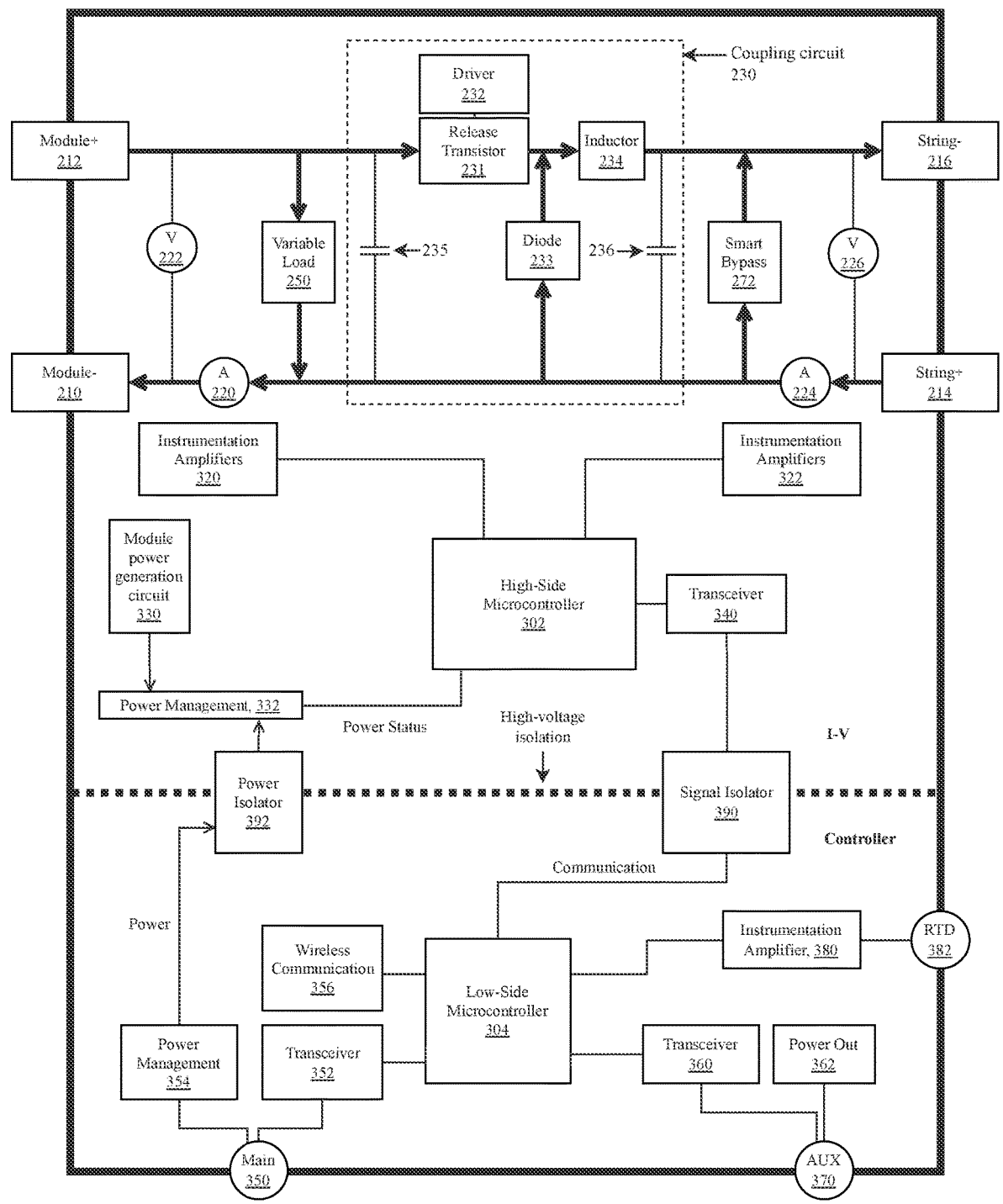
FIG. 3 depicts detailed components of an embodiment of an in-situ I-V unit (200), in accordance with some embodiments.

FIG. 3 depicts detailed components of an embodiment of an in-situ I-V unit (200).

One embodiment of coupling circuit (230) is depicted in FIG. 3. The depicted embodiment has a topology similar to a buck converter, a DC-DC step-down switching power converter in which the output voltage (the voltage that would be measured at 226) is always less than or equal to the input voltage (the voltage that would be measured at 220). A release transistor (231), such as a MOSFET, is operated via driver (232) (which, for example, sets a gate voltage of release transistor (231)) at a high frequency, such as 200 kHz in an exemplary embodiment, at a variable duty cycle ranging from 0% to 100%, wherein 0% corresponds to a fully open/non-conducting state of release transistor (231) and 100% corresponds to a fully closed/connected state of release transistor (231). Diode (233), inductor (234), capacitor (235), and capacitor (236) perform the typical functions of these components in a buck converter topology. With duty cycle of release transistor (231) equal to 100%, output voltage between string − (216) and string + (214) is substantially equal to input voltage between module + (212) and module − (210). As duty cycle is reduced, the time averaged module input voltage (between 212 and 210) increases and the time averaged output voltage (between 216 and 214) decreases. However, string (110) current flowing through in-situ I-V unit (200) via connections (214, 216) is not changed; during portions of the duty cycle of (231) when (231) is non-conducting, current flows through diode (233). In some embodiments, there is no feedback loop, and controller (300) determines the duty cycle of release transistor (231).

Any of the components may be duplicated or paralleled to increase power dissipation capability. Component positions may be interchanged in ways that achieve the same function.

In one embodiment, as depicted in FIG. 3, controller (300) functions are divided between a high-side controller (302), dedicated to controlling the I-V measurement circuitry, and a low-side controller (304), which provides user communication, data storage, calculations, control, communication to networked devices, etc.

In one embodiment, as depicted in FIG. 3, the device is divided into isolated zones, a high-side and low-side, isolated by up to 1500 VDC. This is to protect an operator or other devices connected to in-situ I-V unit (200) from high voltages that may be present on string (110).

In one embodiment driver (232) is controlled by high-side microcontroller (302) according to an algorithm for a full sweep (full I-V curve) or a mini sweep (mini I-V curve).

In one embodiment mini sweep is limited to points within 10% of the maximum power point of PV module DUT (101), or other similarly small threshold.

Other functions of high-side microcontroller (302) include performing measurements via measurement circuits measurement circuits (220, 222, 224, 226) and associated instrumentation amplifiers (320, 322) and other measurement circuits and communicating with low-side microcontroller (304) via transceiver (340) and signal isolator (390).

Division of functions between high-side microcontroller (302) and low-side microcontroller (304) is exemplary. Functions could be apportioned differently or combined.

Power is provided to the device via main power and communication connection (350), which supplies power management circuitry (354) and transceiver (352). Optionally, wireless communication (356) is provided. Power is provided from the low side to the high side via power isolator (392). In one embodiment instrumentation amplifier (380) measures temperature sensor (130) via connection (382), depicted as a connection for an RTD (130). In one embodiment output power is provided via power out (362) to an auxiliary connection (370), together with communication signals via transceiver (360) from low-side microcontroller (304).

In one embodiment, separation into high-side and low-side zones is omitted. In one embodiment, external power and/or communication connections (350) and (370) are omitted, and communication is performed wirelessly or over module and/or string cabling.

Auxiliary connection (370) is used in some embodiments to enable and communicate with networked devices which may be used to calibrate or adjust measured I-V characteristics and/or values calculated therefrom. In some embodiments, networked devices include another in-situ I-V unit (200) measuring another PV module DUT (101), a PV reference cell measuring solar irradiance or effective irradiance, and/or a soiling measurement device measuring a soiling loss.

In one embodiment, when external power via (350) is unavailable, the in-situ I-V unit (200) defaults to a pass-through mode of operation in which release transistor (231) is continuously conducting. In one embodiment, power to maintain the gate control of release transistor (231) at the voltage required for conduction is derived from PV module DUT (101) via module power generation circuit (330) which feeds power management circuit (332) which selects either externally available power or module (101) power. This provides that module (101) current/voltage is passed through even if external power via (350) is missing. Module-derived power via (330) also offsets the power requirements of the in-situ I-V unit (200) by reducing power demand via the main connection (350).

Diode (233) serves the function of bypass (270). In the event that release transistor (231) remains in a non-conducting state for an extended period, diode (233) may encounter significant power dissipation, due to the product of conducted current and diode (233) voltage drop. In one embodiment smart bypass (272), in parallel with diode (233) provides an alternate or supplementary bypass function which reduces power dissipation and therefore reduces heat load. In one embodiment smart bypass (272) comprises an energy harvester which derives a small amount of power from the voltage across diode (233) and uses this power to enable the gates of one or more transistors in parallel with (272) in FIG. 3, thus conducting current with low voltage drop and therefore low power dissipation. In one embodiment, smart bypass (272) operates continuously. In one embodiment smart bypass (272) operates in a hiccup fashion: the energy harvester derives power from the voltage drop across (233), this power puts transistors into conduction which lowers the voltage drop for a time, the derived power is exhausted, the transistors go into open/non-conducting state again, current flows through the diode (233) again, and the cycle repeats. The time average power dissipated by diode (233) is reduced. In one embodiment smart bypass (272) is automatically disengaged whenever voltage between string − (216) and string + (214) exceeds a threshold, indicating bypass is no longer needed. In one embodiment smart bypass (272) is disabled by a signal from high-side microcontroller (302), for example during an I-V sweep.

I-V sweeps are performed as discussed above in connection with FIG. 2B, using variable load (250) and/or coupling circuit (230).

In one embodiment, variable load (250) provides for increasing the current flowing from DUT (101) so that it is larger than the string current flowing in string (110) Is. In one embodiment, the full current flowing in DUT (101) is substantially equal to the string current Is plus the current drawn by variable load (250), or is otherwise comprised of a combination of the string current Is and the variable load (250) current. Advantageously, this allows that DUT (101) may be shifted to a high-current point on its I-V curve while the majority of the module's current is flowing out to string (110) (and thereby to inverter (120) or any other load in place of inverter (120)) and only a small part is dissipated in variable load (250). In one embodiment, as depicted in FIG. 3, coupling circuit (230) is implemented similar to a buck converter, and only has the capability to decrease the current drawn from module DUT (101), by reducing the duty cycle of release transistor (231). (Advantageously, functions of a boost or buck-boost converter are not required.) In one embodiment, the opposite function, increasing the current drawn from module DUT (101) is provided by variable load (250). Thus, in the embodiment depicted in FIG. 3, variable load (250) provides for increasing the current in DUT (101) while coupling circuit (230), as depicted in the figure, provides for reducing the current in DUT (101), and shifts in either direction are accomplished without interrupting string current flowing in string (110), without disconnecting DUT (101), and with only minimal reduction in the amount of power delivered by DUT (101) to the outputs.

In other embodiments, measurement circuits (220, 222, 224, and/or 226) are placed in alternate positions in the circuit while serving the same functions. For example, current measurement circuits (220 and/or 224) could be placed on the high-side leg of the circuit instead of the low-side leg as shown in FIG. 3, or voltage measurement circuits (222, and/or 226) could be placed in other circuit locations to measure essentially the same voltages.

Figure 4A:
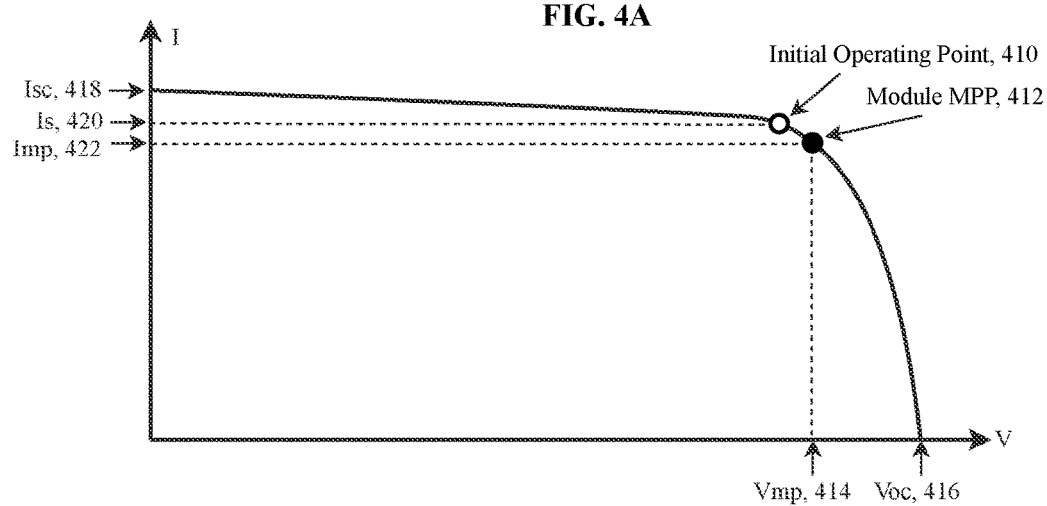
FIG. 4A depicts an exemplary I-V curve of a photovoltaic module operating within a string (110), in accordance with some embodiments.

FIG. 4A depicts an exemplary I-V curve of a photovoltaic module DUT (101) operating within a string (110). Key points on the I-V curve include the short-circuit current Isc (418), the open circuit voltage Voc (416), the maximum power point MPP (412), the maximum power point voltage Vmp (414), and the maximum power point current Imp (422). In this example we consider the case where the string current Is (420) is greater than Imp (422) of PV module DUT (101). Since PV module DUT (101) is in series with the string, it must operate at the same current Is (420), causing PV module DUT (101) to operate at the initial operating point (410) depicted in FIG. 4A. Initial operating point (410) is not the maximum power point MPP (412) of DUT (101). To determine the MPP (412) value of DUT (101) an I-V sweep is required.

Figure 4B:
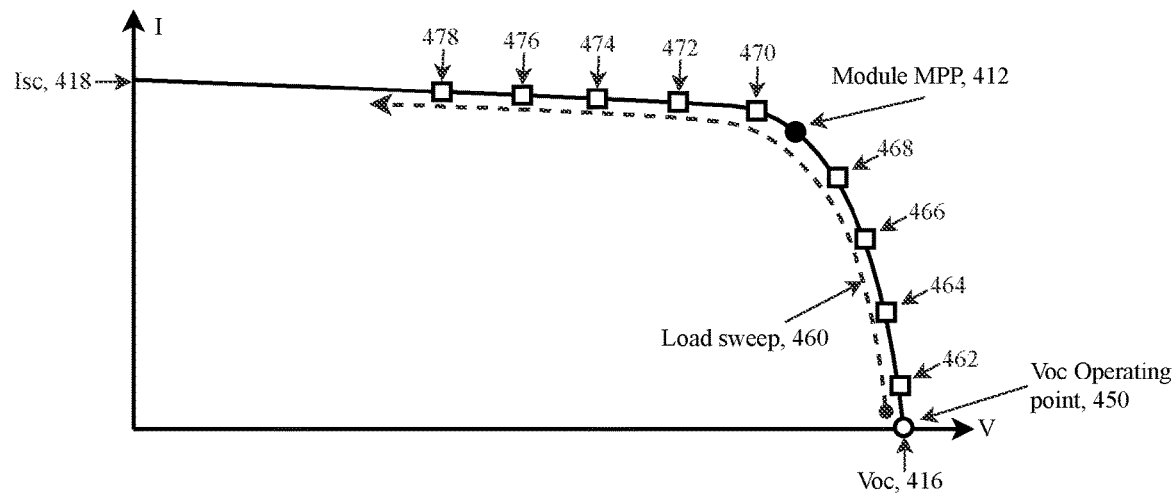
FIG. 4B depicts a full sweep of an I-V curve in FIG. 4A using an embodiment of an in-situ I-V unit (200) depicted in FIG. 3, in accordance with some embodiments.

FIG. 4B depicts a full sweep of an I-V curve in FIG. 4A using an embodiment of an in-situ I-V unit (200) depicted in FIG. 3. Initially, the device of FIG. 3 operates in a pass-through mode, wherein duty cycle of release transistor (231) is 100% and variable load (250) current is 0, such that PV module DUT (101) is directly connected to the output connections (214, 216) with no interference. PV module DUT (101) thus operates at initial operating point (410), set by string current Is (420), as depicted in FIG. 4A. For a full sweep, in one embodiment, release transistor (231) duty cycle is set to 0%, causing PV module DUT (101) to go to open circuit, the Voc operating point (450) depicted in FIG. 4B. Load current of variable load (250) is now progressively increased executing load sweep (460) wherein PV module DUT (101) operating point is progressively moved towards short circuit through exemplary operating points (462, 464, 466, 468, 470, 472, 474, 476, 478). In one embodiment, a short delay is introduced at each operating point. In one embodiment, module current and/or voltage measurement circuits (220, 222) measure current and/or voltage at each operating point, collecting data of the I-V curve. In one embodiment, data are subsequently fit to determine parameters of the I-V curve, such as current, voltage, and/or power of MPP (412), short-circuit current, open-circuit voltage, and/or other parameters. In one embodiment, the full I-V sweep covers substantially the entire I-V curve, ranging from near open circuit to near short circuit. A small number of operating points (462, 464, 466, 468, 470, 472, 474, 476, 478) are depicted for clarity, but any number could be used. In one embodiment, the full I-V sweep is completed in less than 500 milliseconds. In one embodiment, when I-V sweep has been completed, release transistor (231) duty cycle and variable load (250) current are returned to their default conditions of 100% and 0, respectively, such that PV module DUT (101) returns to being directly connected to output connections (214, 216) with no interference.

In some embodiments, additional or alternative steps are used in collection of a full I-V sweep. In one embodiment, in an additional step, variable load (250) current is initially set to a maximum value, PV module DUT (101) short-circuit current (418) is determined, and short-circuit current value is used to determine a step size for progressing between operating points (462, 464, 466, 468, 470, 472, 474, 476, 478). In some embodiments, the sequence progresses from open circuit towards short circuit, while in other embodiments the sequence progresses from short circuit towards open circuit. In some embodiments, the sequence is composed of multiple sub-sequences capturing different portions of the I-V curve.

Figure 4C:
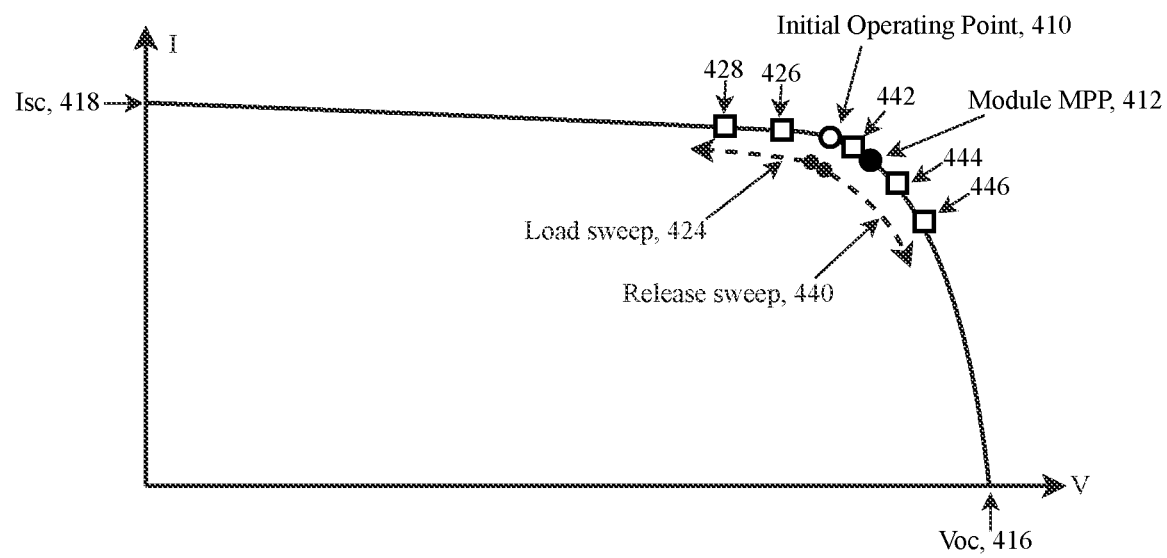
FIG. 4C depicts a mini sweep of an I-V curve in FIG. 4A using an embodiment of an in-situ I-V unit (200) depicted in FIG. 3, in accordance with some embodiments.

FIG. 4C depicts a mini sweep of an I-V curve in FIG. 4A using an embodiment of an in-situ I-V unit (200) depicted in FIG. 3. Initially, the device of FIG. 3 operates in a pass-through mode, wherein duty cycle of release transistor (231) is 100% and variable load (250) current is 0, such that PV module DUT (101) is directly connected to the output connections (214, 216) with no interference, and DUT (101) operates at initial operating point (410). In one embodiment, release transistor (231) duty cycle is then progressively decreased, executing release sweep (440) in which PV module DUT (101) operating point is progressively moved towards open circuit through exemplary operating points (442, 444, 446). Subsequently in one embodiment release transistor (231) duty cycle is returned to 100% and variable load (250) current is progressively increased executing load sweep (424) such that operating point is progressively moved toward short circuit through operating points (426, 428). In one embodiment release transistor (231) duty cycle and variable load (250) current are then returned to default conditions of 100% and 0, respectively, returning PV module DUT (101) to direct connection to output connections (214, 216) with no interference. Measurements performed during release sweep (440) and/or load sweep (424) may be combined to form the mini I-V sweep. In one embodiment, a short delay is introduced at each operating point. In one embodiment, module current and/or voltage measurement circuits (220, 222) measure current and/or voltage at each operating point, collecting data of the mini I-V sweep. In one embodiment, release sweep (440) and/or load sweep (424) stop when measured power of PV module DUT (101), the product of current and voltage measured by current and voltage measurement circuits (220, 222), reaches a threshold, such as 10% below the power measured at initial operating point (410) or 10% below the maximum power measured during release sweep (440) and/or load sweep (424). In one embodiment, following collection of mini I-V sweep, data are subsequently fit to determine parameters of the I-V curve, such as current and voltage of MPP (412). A small number of exemplary operating points (442, 444, 446, 426, 428) of release sweep (440) and load sweep (424) are depicted for clarity, but any number could be used. In one embodiment, mini I-V sweep is completed in less than 250 milliseconds. In one embodiment, when the mini I-V sweep has been completed, release transistor (231) duty cycle and variable load (250) current are returned to their default conditions of 100% and 0, respectively, such that PV module DUT (101) returns to being directly connected to output connections (214, 216) with no interference.

Figure 4D:
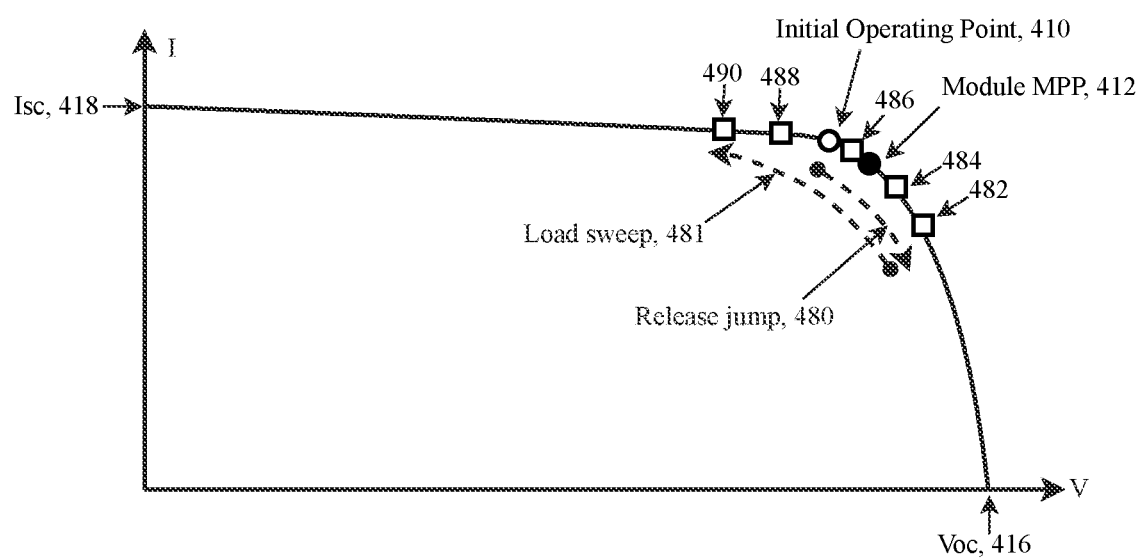
FIG. 4D depicts a mini sweep of an I-V curve in FIG. 4A using an embodiment of an in-situ I-V unit (200) depicted in FIG. 3, in accordance with some embodiments.

FIG. 4D depicts another embodiment of a mini sweep of an I-V curve in FIG. 4A using an embodiment of an in-situ I-V unit (200) depicted in FIG. 3. Initially, the device of FIG. 3 operates in a pass-through mode, wherein duty cycle of release transistor (231) is 100% and variable load (250) current is 0, such that PV module DUT (101) is directly connected to the output connections (214, 216) with no interference, and DUT (101) operates at initial operating point (410). In one embodiment, release transistor (231) duty cycle is then decreased to a fixed value less than 100%, executing release jump (480) in which PV module DUT (101) operating point is moved in a large step towards open circuit to exemplary operating point (482). Subsequently, in one embodiment, release transistor (231) duty cycle is maintained at the fixed value while variable load (250) current is progressively increased executing load sweep (481) such that the DUT (101) operating point is progressively moved toward short circuit through operating points (482, 484, 486, 488, 490). In one embodiment release transistor (231) duty cycle and variable load (250) current are then returned to default conditions of 100% and 0, respectively, returning PV module DUT (101) to direct connection to output connections (214, 216) with no interference. In one embodiment, a short delay is introduced at each operating point. In one embodiment, module current and/or voltage measurement circuits (220, 222) measure current and/or voltage at each operating point, collecting data of the mini I-V curve. In one embodiment, release jump (480) and/or load sweep (481) are configured such that the power output of DUT (101) is maintained within 10% of its maximum power or the power of initial operating point (410). In one embodiment, following collection of mini I-V sweep, data are subsequently fit to determine parameters of the I-V curve, such as current and voltage of MPP (412). A small number of exemplary operating points (482, 484, 486, 488, 490) are depicted for clarity, but any number could be used. In one embodiment, mini I-V sweep is completed in less than 250 milliseconds.

Advantageously, embodiments similar to that depicted in FIG. 3 executing sequences depicted in FIG. 4C and FIG. 4D, and other similar sequences incorporating the same steps in different orders and combinations, allows that DUT (101) may be shifted to higher-current points on its I-V curve while DUT (101) remains connected to the output (i.e. without disconnection of DUT (101)), most of the module's current is flowing out to string (110), and only a small part is dissipated in variable load (250). Advantageously, this minimizes disruption to string (110) and inverter (120) (or load or other power utilization system in place of inverter (120)), maximizes efficiency, and minimizes power dissipation on variable load (250), permitting more frequent measurement and/or smaller heat sinks and enclosure corresponding to lower power dissipation.

Advantageously, mini I-V sweep depicted in FIG. 4C and/or FIG. 4D, and other similar embodiments incorporating the same steps in different orders and combinations, result in minimal disturbance to the remainder of the PV array and to inverter (120), because PV module DUT (101) output power delivered to inverter (120) is reduced from its maximum value by less than a small threshold, for example 10%, and for only a short time. Thus, mini I-V sweep advantageously determines PV module DUT (101) maximum power with minimal disturbance to inverter (120).

Although mini I-V sweeps depicted in FIG. 4C and FIG. 4D are configured to include maximum power point MPP (412) in order that MPP (412) current, voltage, and or power may be determined, in other embodiments mini I-V sweeps and/or jumps to specific operating points and conditions, including jumping variable load (250) current and/or release transistor (231) duty cycle to specific values, may be configured to cover other portions of interest of the I-V curve, such as for determining Isc (418) and/or Voc (416) without performing a full I-V sweep. In some embodiments various portions of the I-V curve are measured in various orders in a sequence. In one embodiment, controller (300) adjusts variable load (250) to quickly shift DUT (101) operating point from the initial operating point (410) to Isc, to measure the Isc value without stopping at intervening points. In one embodiment, controller (300) adjusts release transistor (231) duty cycle quickly to 0% to shift DUT (101) operating point from the initial operating point (410) to Voc, to measure the Voc value without stopping at intervening points. In some embodiments such measurements of Isc and/or Voc are performed by themselves while in other embodiments they are performed as part of a sequence with the sequences described in connection to FIG. 4B, FIG. 4C, or FIG. 4D. In some embodiments, initial measurement of Isc and/or Voc is used to optimize step sizes for any other part of a sequence. In some embodiments, step sizes are dynamically adjusted to optimize usage of measurement points; for example, current step sizes may be reduced where the slope of the I-V curve is low and increased where its slope is high.

With reference to FIG. 4C and/or FIG. 4D, in some embodiments, additional or alternative steps are used in collection of a mini I-V sweep. In various embodiments, load sweep (424) is performed without release sweep (440) or release jump (480), or release sweep (440) or release jump (480) are performed without load sweep (424), or load sweep (424), release sweep (440), and/or release jump (480) are performed in various orders and combinations to measure various portions of the I-V curve in various orders.

In various embodiments, step sizes for load sweep (424) and/or release sweep (440) and/or release jump (480) are based on pre-determined values, are determined from measurements at initial operating point (410) or other operating points along I-V curve or characteristics of the I-V curve, and/or are dynamically determined to optimize I-V measurement with minimum number of measurement points.

In some embodiments release transistor (231) is operated in a simple open or closed fashion, equivalent to duty cycle being 0% or 100%. In some embodiments, release transistor (231) is omitted and coupling circuit (230) directly connects module connections (210, 212) and string connections (214, 216).

Advantageously, use of variable load (250) allows that the I-V curve of DUT (101) may be measured even when string current Is (420) is 0 and initial operating point (410) is near open-circuit, or equivalently when string (110) is disconnected, not operating, or not present.

FIG. 4A, FIG. 4B, FIG. 4C, and FIG. 4D depict an exemplary situation where initial operating point (410), set by string current Is (420), is at a current greater than the maximum power point current Imp (422). However, the embodiments described apply also other situations in which initial operating point (410) is at greater, lesser, or equal current to maximum power point MPP (412) current Imp (422).

In some embodiments, controller (300) uses measurements from current measurement circuits (220, 224) and/or voltage measurement circuits (222, 226) to determine the initial operating point (410) and based on this measurement controller (300) selects a sequence of steps to measure the I-V curve. This selection may comprise choosing one of the sequences depicted in FIG. 4B, FIG. 4C, or FIG. 4D or another sequence. For example, if initial operating point (410) corresponds to open-circuit of DUT (101), the sequence depicted in FIG. 4B may be automatically chosen. Or, if initial operating point (410) has current below Imp, release sweep (440) or release jump (480) could be omitted. Or, if initial operating point (410) is has current above Imp, load sweep (424, 460, 481) could be omitted.

Figure 5:
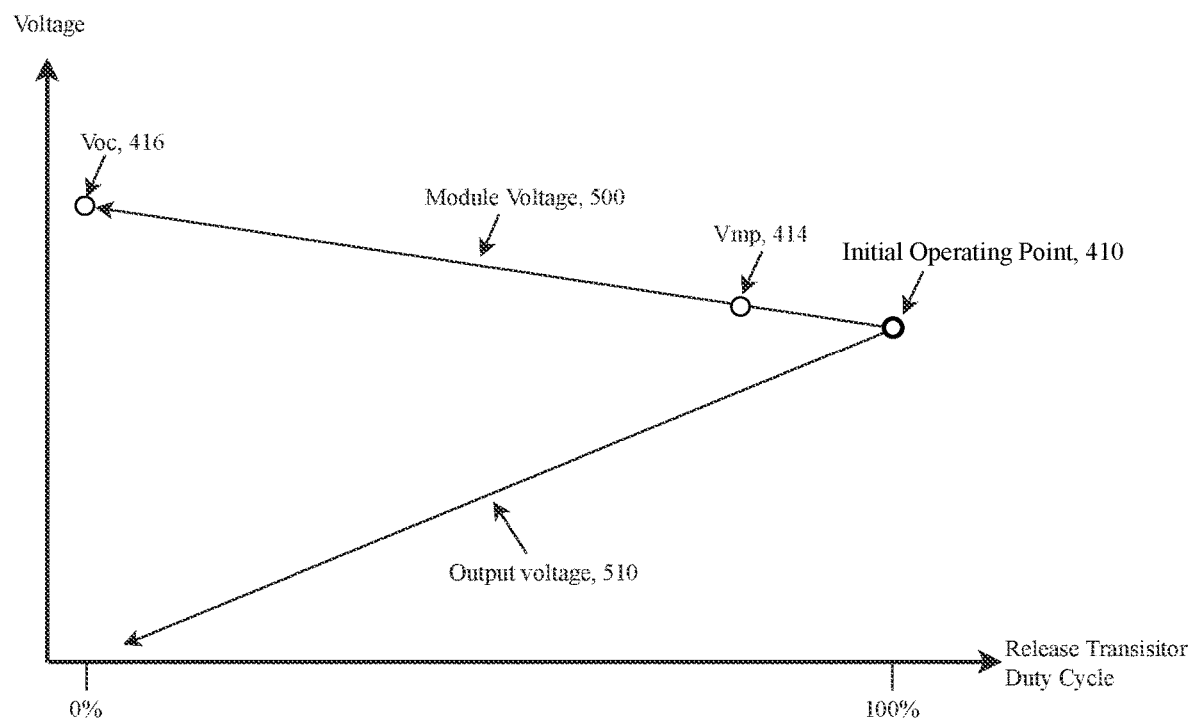
FIG. 5 depicts schematically the variation in the voltage of a module device under test (101) and in-situ I-V unit (200) output voltage during release sweep (440) indicated in FIG. 4C, in accordance with some embodiments.

FIG. 5 depicts schematically the variation in the voltage of a PV module DUT (101) and in-situ I-V unit (200) output voltage during an embodiment of release sweep (440) depicted in FIG. 4C. Initially release transistor (231) duty cycle is 100% and PV module DUT (101) operates at initial operating point (410). As release transistor (231) duty cycle is reduced, PV module DUT (101) voltage (500) moves towards open circuit (416) while in-situ I-V unit (200) output voltage (510), measured from string + (214) to string − (216), moves towards 0. Similarly, for the sequence depicted in FIG. 4D, release jump (480) would cause DUT (101) operating point to move abruptly from initial operating point (410) to another operating point at higher module voltage on (500), with corresponding lower output voltage (510).

In some embodiments, multiple in-situ I-V units (200) may share data in order to more efficiently implement a particular measurement application that involves comparison of multiple DUTs (101) and/or other instruments. In some embodiments, communication between in-situ I-V units (200) is performed via auxiliary connections (370).

Figure 6:
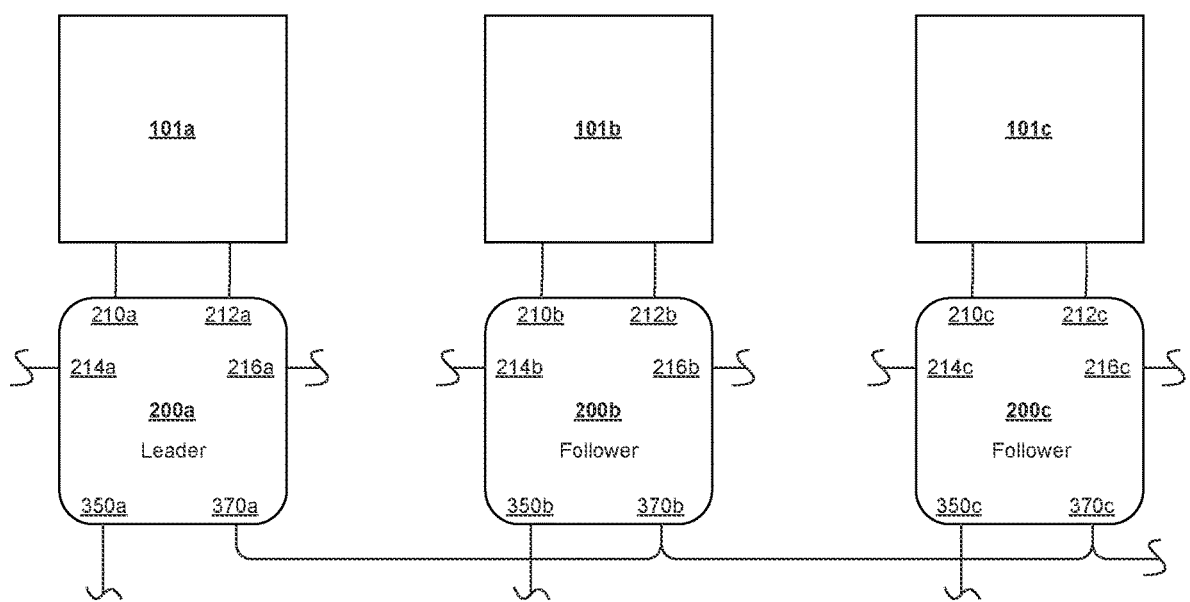
FIG. 6 depicts schematically an embodiment employing multiple in-line I-V units (200a, 200b, 200c) in which a leader unit (200a) shares data with follower units (200b, 200c), in accordance with some embodiments.

FIG. 6 depicts schematically an embodiment employing multiple in-situ I-V units (200a, 200b, 200c) in which a "leader" unit (200a) shares data with "follower" units (200b, 200c). In FIG. 6 each lettered reference numeral has the same function as its non-lettered counterpart in FIG. 3. Each in-situ I-V unit (200a, 200b, 200c) is connected to a DUT (101a, 101b, 101c) via module connections (210a, 212a, 210b, 212b, 210c, 212c) and may also be connected to one or more strings (110) (not shown in FIG. 6) via string connections (214a, 216a, 214b, 216b, 214c, 216c) such that DUTs (101a, 101b, 101c) operate in series within one or more strings (110).

For example, leader unit (200a) may be connected to a PV module DUT (101a) which is maintained in a clean state. Measurements performed from DUT (101a) may be used to determine an effective irradiance observed by DUT (101a). The leader unit (200a) may then share these data with follower units over a network accessed via auxiliary connection (370a), allowing follower units to receive the data via auxiliary connections (370b, 370c) and to use the effective irradiance as a reference to determine a performance metric of their connected PV module DUTs (101b, 101c). Performance metrics could include relative irradiance, relative power, soiling losses, soiling ratios, degradation ratios, and others.

In some embodiments, each in-situ I-V unit (200a, 200b, 200c) receives both power and user host/client communication via main connections (350a, 350b, 350c). In some embodiments, auxiliary (370a) delivers both power and communication signals from in-situ I-V unit (200a) to in-situ I-V units (200b, 200c) via auxiliary (370b, 370c). In some embodiments, in-situ I-V units (200a, 200b, 200c) are independently powered, for example by DUTs (101*a*, 101*b*, 101*c*). In some embodiments, in-situ I-V units (200*a*, 200*b*, 200*c*) communicate wirelessly or over module or string connections or wiring. In some embodiments data are shared between in-situ I-V units (200*a*, 200*b*, 200*c*) in both directions. In some embodiments, data are shared between in-situ I-V units over the user's host/client network via main connections (350*a*, 350*b*, 350*c*).

In FIG. 6, only three in-situ I-V units are depicted for simplicity, including one leader (200*a*) and two followers (200*b*, 200*c*); however, any number of leaders (200*a*) and/or followers (200*b*, 200*c*) could be used.

Figure 7:
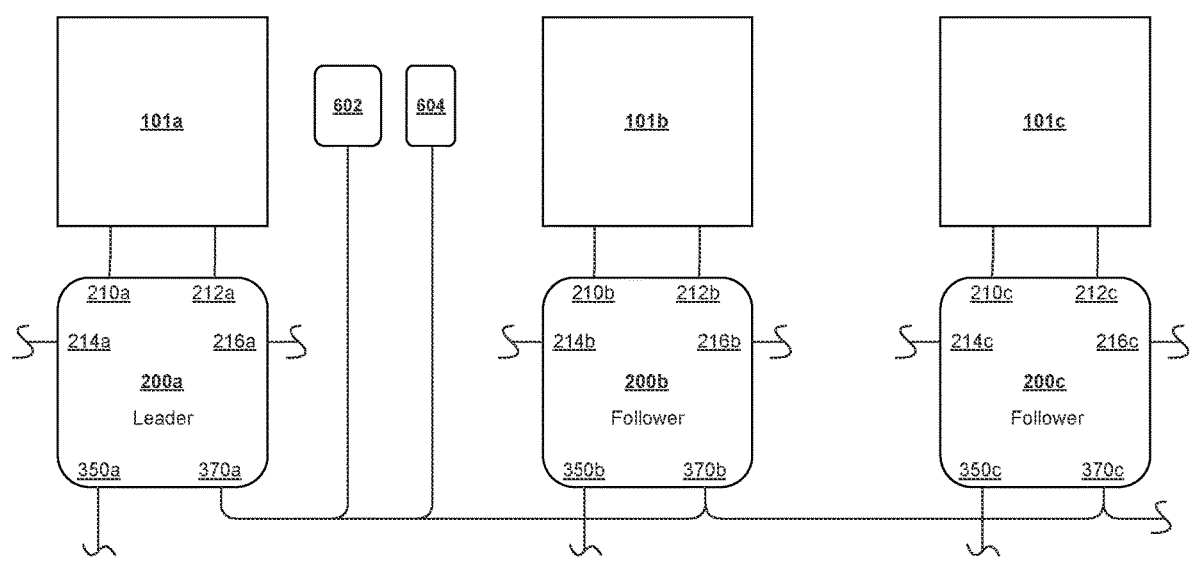
FIG. 7 depicts schematically an embodiment employing multiple in-line I-V units (200a) in which a leader unit collects data from auxiliary devices (602, 604) and shares results with follower units (200b, 200c), in accordance with some embodiments.

FIG. 7 depicts schematically another embodiment employing multiple in-line I-V units (200*a*, 200*b*, 200*c*) similar to the embodiment of FIG. 6, in which a leader unit (200*a*) collects data from additional auxiliary devices (602) and/or (604) and shares results with follower units (200*b*, 200*c*). For example, leader unit (200*a*) may collect irradiance data from an irradiance sensor (604) and/or soiling data from an optical soiling sensor (602) (such as the Mars Optical Soiling Sensor, DUSST, DustIQ, or similar devices, described, respectively, in the following references, each of which is incorporated herein by reference: Gostein, Michael, et al. "Mars soiling sensor™", 2018 IEEE 7th World Conference on Photovoltaic Energy Conversion (WCPEC) (A Joint Conference of 45th IEEE PVSC, 28th PVSEC & 34th EU PVSEC), IEEE, 2018; Korevaar, Marc, et al. "Novel soiling detection system for solar panels," 33rd European Photovoltaic Solar Energy Conference and Exhibition, 2017; Fernández-Solas, Álvaro, et al. "Design, characterization and indoor validation of the optical soiling detector "DUSST", Solar Energy 211 (2020): 1459-1468.). It may use the soiling data from the optical soiling sensor (602) to correct the reading of the irradiance sensor (604), yielding a more accurate irradiance measurement free of the influence of soiling particles. The leader unit (602) may then share these data with follower units over a network, as described in connection with FIG. 6, allowing follower units (200*b*, 200*c*) to use the irradiance as a reference to determine a performance metric of their connected PV module DUTs (101*a*, 101*b*, 101*c*), such as performance metrics described above. While only three in-situ I-V units are depicted for simplicity, including one leader (200*a*) and two followers (200*b*, 200*c*), any number of leaders (200*a*) and/or followers (200*b*, 200*c*) could be used.

Concepts, processes, and components described in this disclosure could be used in different combinations, sequences, or pluralities and each such combination, sequence, or plurality is within the scope of this disclosure. In alternative embodiments a device or method according to the present disclosure could be divided into multiple devices or steps each having a portion of the functions described, combined into a larger device or sequence of steps having additional functions, or duplicated to serve in parallel or series fashion.

The invention claimed is:

1. An in-situ current-voltage (I-V) measurement device, comprising
   module connections,
   string connections,
   a variable load,
   a current measurement circuit,
   a voltage measurement circuit, and
   a controller coupled to said variable load, said current measurement circuit, and said voltage measurement circuit, wherein said device is configured to couple via said module connections to a module and via said string connections to a string,
   said voltage measurement circuit is configured to measure a module voltage across said module,
   said current measurement circuit is configured to be in a series combination with said module and to measure a module current through said module,
   said variable load is configured to be in a parallel combination with said series combination of said module and said current measurement circuit, and
   said string is configured to be in series with said parallel combination of said variable load and said series combination of said module and said current measurement circuit, and wherein said controller is configured to shift an I-V operating point of said module based at least upon varying said variable load and to receive current readings from said current measurement circuit and voltage readings from said voltage measurement circuit.

2. The device of claim 1, wherein said operating point shifts towards higher current as a current of said variable load is increased.

3. The device of claim 1, wherein said module current of said module comprises a combination of a string current of said string and a variable load current of said variable load.

4. The device of claim 1, wherein said controller is configured to measure at least a portion of an I-V curve of said module based at least upon varying said variable load and recording said readings from said module current measurement circuit and said module voltage measurement circuit.

5. The device of claim 1, wherein in a pass-through operation mode of said device, said controller configures said variable load to draw substantially zero current from said module.

6. The device of claim 1, wherein said module connections comprise first and second module connections configured to connect said device to said module and said string connections comprise first and second string connections configured to connect said device to said string.

7. The device of claim 6, comprising a coupling circuit connecting currents flowing between said first string connection and said first module connection and between said second module connection and said second string connection.

8. The device of claim 7, wherein said coupling circuit is configured as a DC-DC switching power converter, comprising at least a release transistor configured to alternately enable and disable current flow, wherein a duty cycle of said release transistor is controlled by said controller, and wherein said controller is configured to shift said operating point of said module based at least upon varying said duty cycle.

9. The device of claim 8, wherein said operating point of said module shifts towards lower current as said duty cycle is reduced.

10. The device of claim 8, wherein said controller is configured to measure at least a portion of an I-V curve of said module based at least upon varying said duty cycle and recording said readings from said current measurement circuit and said voltage measurement circuit.

11. The device of claim 8, wherein in a pass-through operation mode of said device, said controller configures said duty cycle to 100%, continuously enabling said current flow through said release transistor.

12. The device of claim 8, wherein said controller configures said duty cycle at a fixed value less than 100% and varies said current of said variable load to shift said operating point along an I-V curve of said module.

13. The device of claim 12, wherein said controller is configured to measure at least a portion of said I-V curve based at least upon varying said variable load, varying said duty cycle, and recording said readings from said current measurement circuit and said voltage measurement circuit.

* * * * *